United States Patent [19]

Harr

[11] 4,163,909
[45] Aug. 7, 1979

[54] PEAK DETECTING CIRCUITRY AND DUAL THRESHOLD CIRCUITRY THEREFOR

[75] Inventor: Jerome D. Harr, San Jose, Calif.

[73] Assignee: International Business Machines Corporation, Armonk, N.Y.

[21] Appl. No.: 827,048

[22] Filed: Aug. 23, 1977

[51] Int. Cl.² ............................................. H03K 5/153
[52] U.S. Cl. .................................... 307/351; 307/359; 328/151
[58] Field of Search ............... 307/350, 351, 358, 359; 328/146, 147, 148, 149, 150, 151; 340/146.3 AG, 146.3 AC, 146.3 C

[56] References Cited

U.S. PATENT DOCUMENTS

3,702,942  11/1972  Aguirre ............................ 328/151 X

Primary Examiner—John Zazworsky
Attorney, Agent, or Firm—George E. Roush

[57] ABSTRACT

This peak detecting circuitry avoids false peak indication while using component circuits of smaller dynamic range and lower voltage energizing power supplies than is possible with contemporary circuitry. The electric wave having peaks for which the times of occurrence are desired, is applied between an erecting (non-inverting) input terminal of a differential amplifying circuit and a point of fixed reference potential. A capacitor is connected between the inverting input terminal of the differential amplifier circuit and the reference point. The differential output of the amplifier circuit is applied through individual amplifier circuits to the capacitor for charging and discharging it in accordance with the instantaneous polarity of the electric wave. A unilateral impedor is interposed in the charging circuit in the form of a diode or a transistor for preventing discharge upon reversal of the electric wave slope. Latching and like circuitry is coupled to the detecting circuitry for indicating the detection. An electric connection, preferably including a diode element and/or a resistance element, is arranged between the indicating circuit and the amplifying circuit for dynamically altering the threshold from a high value as the peak of the wave containing noise is approached to a relatively low value as the peak of the wave containing timing information is approached.

20 Claims, 10 Drawing Figures

FIG. 8  TIME →

FIG. 9

PEAK DETECTING CIRCUITRY AND DUAL THRESHOLD CIRCUITRY THEREFOR

This application contains subject matter in common with a copending U.S. patent application Ser. No. 684,414 filed on May 7, 1976 and abandoned upon the filing of the instant continuation-in-part application.

The invention is an improvement over that shown and described in U.S. Pat. No. 3,895,237 issued on the July 15, 1975 to Jerome Danforth Harr for a "Peak Detector".

The invention relates to peak detecting circuitry and it particularly pertains to such circuitry for detecting the occurrence of peak values of electric waves having amplitudes normally smaller than the amplitude of detected signals stored for subsequent application.

Peak detecting circuits are well known. For many applications, the circuitry disclosed in the above-mentioned U.S. Pat. No. 3,895,237 is excellent. However, with the advent of the later developed semiconductor circuitry and other new electronic components, some disadvantages appear. One disadvantage is that power supplies of relatively widely differing voltages are required. Another disadvantage is that the circuitry requires component circuits of relatively wider dynamic ranges.

According to one aspect of the invention, electric wave peak detecting circuitry is arranged for operation about the difference in voltage or current between the incoming wave and the electric energy storing device. According to another aspect of the invention electric wave peak detecting circuitry is arranged for dynamically altering the threshold of such circuitry from one threshold to another in accordance with the polarity of the approaching peak to be detected. Such circuitry as will be described hereinafter is novel, but the applicant is aware of prior art having some features in common with the circuitry of the invention as shown in these U.S. Patents:

| | | | |
|---|---|---|---|
| 3,309,618 | 3/1967 | Harris et al | 330/69 |
| 3,489,921 | 1/1970 | Meitz et al | 307/103 |
| 3,518,560 | 6/1970 | Avignon | 329/104 |
| 3,541,457 | 11/1970 | Leighty et al | 328/150 |
| 3,916,326 | 10/1975 | Woyton | 328/118 |
| 3,969,677 | 7/1967 | Woyton | 328/140 |
| 3,999,083 | 12/1976 | Bumgardner | 307/325 |
| 4,007,382 | 2/1977 | Warberg | 307/236 |

And in the technical literature:

R. E. Penny "Slope Detector" IBM Technical Disclosure Bulletin Vol. 16, No. 8, January 1974, p. 2606.

The patent to Harris and Simmons is directed to circuitry for holding values between peaks of an electric wave, which values are proportional to the successive peaks until the next peak is reached. The circuitry disclosed does not indicate the times of occurrence of the peaks by a bilevel electric but samples and holds from peak-to-peak value.

The patent to Mietz and Earl discloses a peak detector arrangement having an input filter circuit, a pair of unilateral semiconductor devices for differentially charging a capacitor, and a comparator circuit for determining the direction in which the capacitor is charged. Two transistors in emitter-follower configuration interpose two $V_{e-b}$ voltage drops by which the storage capacitor follows the input wave, however, there is no input amplifier operating on the difference between the voltage stored in the capacitor and that of the input wave for lowering the supply voltage requirement.

The patent to Leighty and Sullivan and the publication to Penny each show a peak occurrence and/or slope detector circuit having a high gain open loop amplifier in the input stage as against a controlled low-gain, closed-loop amplifying circuit of the invention. Further, the circuitry according to the invention is coupled to a latching circuit having two different and separated trigger levels imparting a desired hysteresis effect lacking in these prior art arrangements. Therefore, these triggering levels are not tied to the direct potential level of the input signal as in these prior art arrangements, but are related directly to the peaks of the input waveform whereby the indication is independent of the direct current level, or the offset level, or the amplitude of the input signal.

The patent to Avignon discloses bipolar binary signal detector circuitry having a feedback circuit including a peak detector that generates an adjustable threshold voltage applied to a symmetrical threshold detector set. The patents to Woyton disclose feedback circuitry developing voltage by selecting one polarity and rejecting the other of a bipolar electric. The Bumgardner patent discloses variable thresholding circuitry for a noise measurement wherein the threshold is a specified difference from the variable frequency weighted noise measured, while the patent to Warburg shows circuitry for switching from one threshold level to another in response to a feed back voltage. In all of these patents the threshold voltages are applied for obtaining an indication that the input signal is above and/or below the threshold, while in the circuitry according to the invention the thresholding functions from the peaks of the wave to values algebraically less than the peak values. Further in the circuitry according to the invention the threshold associated with peaks of given polarity is different from that associated with peaks of opposite polarity, which arrangement is not found in any of those references, whether alone or in combination of plausible teaching.

According to the invention, the objects indirectly referred to hereinbefore and those that will appear as this specification progresses obtain in peak detecting circuitry wherein the electric wave having peaks for which the times of occurrence are desired, is applied between an erecting (non-inverting) input terminal of a differential amplifying circuit and a point of fixed reference potential. An electric energy storing device in the form of a capacitor or an inductor is connected between the inverting input terminal of the differential amplifier circuit and the point of reference potential. The differential output of the amplifying circuit is applied through individual amplifier circuits to the electric energy storing device, preferably in the form of a capacitor or an inductor, for charging and discharging it in accordance with the instantaneous polarity of the electric wave. A unilateral impedor in the form of a unidirectionally isolating diode or a transistor is interposed in the charging circuit for preventing discharge upon reversal of the electric wave slope. Latching circuitry is coupled to the detecting circuitry for pegging the detection.

More specifically, peak detecting circuitry according to the invention comprises an input differential amplifying circuit comprising a pair of transistors. The input voltage or current wave is applied between the base electrode of one transistor and a point of fixed potential, while the capacitor or inductor storing component is connected between the base electrode of the other transistor and the point of fixed potential. A load resistor in the collector circuit of the other transistor is connected to the emitter electrode of an amplifier transistor having a base electrode similarly connected to a load resistor in the collector circuit of the one amplifying circuit transistor. A load resistor in the collector circuit of the amplifying transistor develops a voltage for charging a capacitor, or alternatively draws current through an inductor. A semiconductor device interconnects the latter collector electrode to the capacitor, or inductor, at the base of the other transistor so that back current cannot flow to discharge the store through this circuit as the peak of the wave is passed. A diode is suitable in many applications. If a greater drive is required, another transistor is cascaded for amplification and unilateral isolation as well. Another amplifier transistor is similarly but oppositely connected to the load resistors and the collector electrode circuit is completed by way of the base-emitter circuit of a further transistor having the collector-emitter circuit connected across the capacitor, or inductor, for discharging the latter when the input electric wave is going negatively. The base-emitter voltage drops of these two amplifier transistors constitute the offset voltages or dead zones by which the storage device lags the input wave.

Sensing circuitry is connected to the collector electrodes of the amplifier transistors for setting and resetting a Schmitt trigger latching circuit for pegging the action of the peak detector circuitry. The hysteresis characteristic of the Schmitt circuit is adjusted to a value equal to the algebraic sum of the offset voltages if desired.

Further according to the invention peak detecting circuitry is arranged to alter the threshold voltage dynamically whereby a relatively high value of threshold voltage is applied when approaching a peak value of the input wave having a relatively high amount of noise and thereafter a relatively low value of threshold voltage is applied when approaching the opposite peak having the timing information.

Basically an electric feedback connection is made between the digital data output terminals of the detecting circuitry and the threshold biasing subcircuitry of the detecting circuitry whereby the threshold voltage is altered in response to the change in digital data output. In a dual threshold peak detecting circuit, for example, more specifically containing a positive peak detecting subcircuit arranged for resetting a latching flip-flop circuit and a negative peak detecting subcircuit for setting the latching circuit a connection is made between the output terminal of the latching circuit and the biasing circuit of the negative peak detecting subcircuit. A resistive and/or a unilateral impedance device is interposed for adjusting the feedback voltage to an optimum value for the application at hand.

Figure 1:
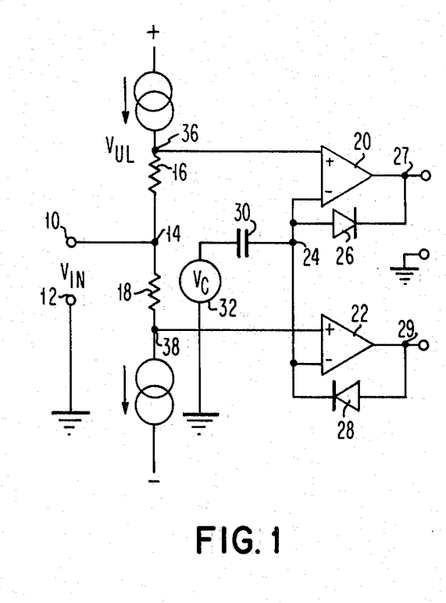
FIG. 1 is a functional diagram of circuitry useful in an understanding of the fundamentals of peak detecting circuitry according to the invention.

A functional diagram useful in explaining the basic fundamentals of peak detecting circuitry according to the invention is shown in FIG. 1. An electric wave is applied to input terminals 10, 12 for determining the time of occurrence of a peak above and below a dead zone which according to the invention is made to vary with the input wave as will be shown in greater detail hereinafter. One input terminal 10 is connected to the junction 14 of a pair of resistors 16 and 18. The extremities of these resistors are individually connected to like input terminals of a pair of high open-loop gain differential amplifying circuits 20, 22, having the other input terminals connected in common at another junction 24. From the junction 24 oppositely poled diodes 26 and 28 are individually coupled to the output terminals of the amplifier circuits 20, 22 respectively. A capacitor 30 has one terminal connected to the junction 24 and the other terminal connected to a source of constant voltage 32. It should be understood that the times of occurrence of peaks of a current wave are detected by a circuit of substantially the same configuration as the one shown but with a current storing circuit in the form of an inductor and a constant current source connected thereto. In the prior art arrangement described and illustrated in U.S. Pat. No. 3,895,237, hereinbefore mentioned, fixed reference voltages were maintained at junctions 36 and 38 and a time varying voltage was applied to the capacitor 30. According to the invention, a fixed voltage $V_c$ is applied to the capacitor 30 and time varying voltages result at junctions 36 and 38 in accordance with the input voltage waveform applied at the waveform input terminals 10, 12.

Figure 2:
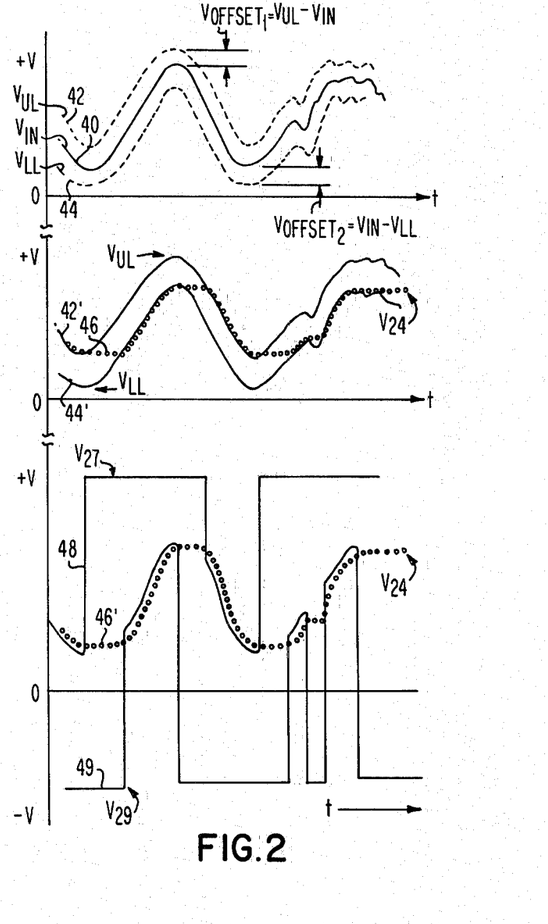
FIG. 2 is a graphical representation of waveforms particularly related to the fundamental circuitry and further useful in an understanding of the circuitry according to the invention.

Waveforms relating to the circuit arrangement according to the invention are graphically represented in FIG. 2. The voltage input wave is represented by a curve 40 of typical waveform encountered in applications of circuitry according to the invention. A curve 42 represents an upper limit voltage $V_{UL}$ at the junction 36, while a curve 44 represents a lower limit voltage $V_{LL}$ at the junction 38. In the interest of clarity, the limit voltages $V_{UL}$, $V_{LL}$ are repeated substantially as curves 42' and 44' respectively. As the input voltage $V_{IN}$ varies, the limit voltages $V_{UL}$ and $V_{LL}$ follow the voltage drop across the resistors 16 and 18. The amplifier circuits 20 and 22 then operate to maintain the voltage $V_{24}$ at the junction 24 between the two limits as shown by a curve 46. Again, in the interest of clarity, the junction voltage $V_{24}$ is repeated as a curve 46' and the output voltages of the amplifier circuits 20, 22 at junctions 27, 29 are represented by curves 48 and 49, which serve to show how the amplifier circuits 20, 22 act to control the voltage $V_{24}$ at the junction 24. When it is necessary that the capacitor 30 be charged in order to keep the junction voltage $V_{24}$ greater than or equal to the lower limit voltage, $V_{LL}$, the output voltage of the amplifier circuit 22 at the junction 29 rises above the junction voltage $V_{24}$ sufficiently so that the diode 28 conducts. Similarly, the voltage $V_{27}$ at the output of the amplifier circuit 20 goes negative to maintain junction voltage $V_{24}$ less than or equal to the upper limit voltage, $V_{UL}$, by discharging the capacitor 30 through the diode 26. The offset voltages which provide the dead zone, are produced by the voltage drops across the resistors 16 and 18. Other arrangements are available for producing the offset voltages, for example, a forward base-to-emitter voltage $V_{be}$, drop of a transistor. Such circuitry will be described hereinafter.

Such offset voltages are fixed at approximately 0.6 volts and the dead zone, made up of the two, upper and lower, offset voltages, is approximately 1.2 volts. For a dead zone of 1.2 volts, the peak-to-peak signal voltage $V_{IN}$ is 12 volts on the basis of the dead zone representing a 10% threshold, as is conventionally the case. Under such conditions, a larger dynamic range of circuitry and higher power supply voltages would be required than are available for a great many applications. This requirement is obviated, according to the invention, as will be seen from a basic embodiment of the invention shown functionally in FIG. 3. An input amplifying circuit 50 has one input terminal connected to the input voltage terminal 10 and the other input terminal connected to the junction 24. In this circuit arrangement, the amplifying circuit 50 is arranged to produce an output voltage which is proportional to the difference between the input voltage $V_{IN}$ and the voltage $V_C$ on the capacitor 30. In this diagram, the offset voltages are represented as batteries 52, 54 connected in the input circuits of the amplifying circuits 20, 22. These amplifier circuits have their input circuitry cross-coupled to the balanced output terminals of the amplifying circuitry 50.

Figure 3:
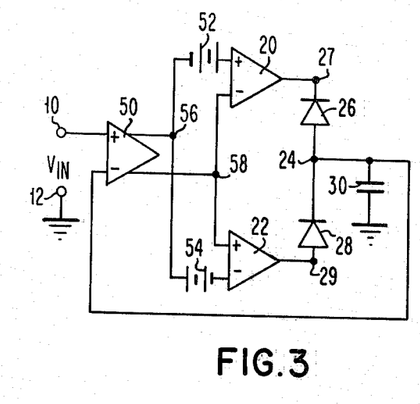
FIG. 3 is a functional diagram of basic circuitry according to the invention.
Figure 4:
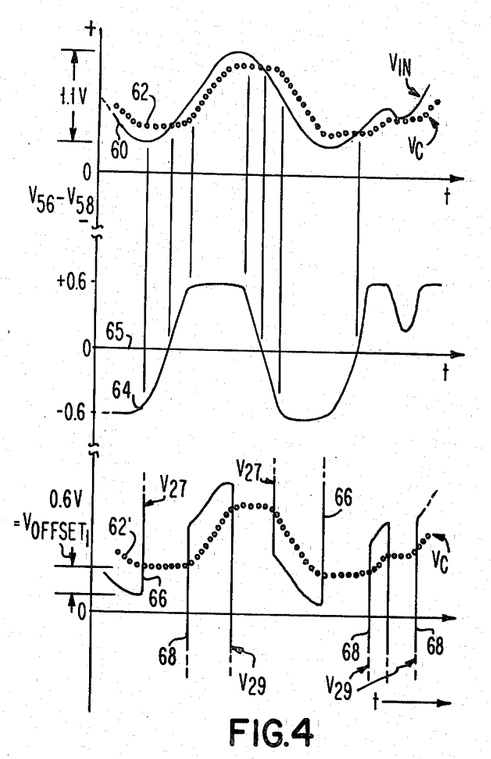
FIG. 4 is a graphical representation of waveforms relating to the basic circuitry according to the invention.

Waveforms useful in an understanding of the operation of the circuit arrangement according to the invention as illustrated in FIG. 3 are graphically represented in FIG. 4. In a common application, for example, the input voltage $V_{IN}$ is 1.1 volts peak-to-peak and the offset voltages are 0.6 volts each, with a desired threshold of 10%, and amplifying circuit 50 has a voltage gain of 10.9. Under these conditions, the input voltage $V_{IN}$ can never be farther away from the voltage $v_C$ on the capacitor than ±5% or 0.055 volts. When the input voltage does start to go beyond this value in either direction, the differential output voltage of the amplifying circuit 50 rises above or drops below ±0.6 volts, thereby overcoming one of the offset voltages provided by the batteries 52 or 54, and one of the amplifier circuits 20 or 22 becomes active to prevent this difference from increasing according to the invention. The voltage across the input terminals 10, 12 is graphically represented by a curve 60, while the voltage across the capacitor 30 is represented by a curve 62. The differential voltage at the output of the amplifying circuit 50 across the junctions 56 and 58 is represented by another curve 64, which crosses the zero axis line 65 at the same time instants when the instantaneous values represented by the curves 60 and 62 are equal. The voltage across the capacitor 30 is again represented by a curve 62' for comparison with the portions of curves 66 and 68 representing the voltages at the junctions 27 and 29 respectively. These voltages have large peak-to-peak swings, whereby only those portions of these waves in the vicinity of the voltage $V_C$ wave on the capacitor 30 are shown. From these curves, it can be seen that according to the invention, the gain of the input amplifying circuit 50, as well as the input offset voltages at junctions 56 and 58 control the threshold voltage of the peak detecting circuit.

Figure 5:
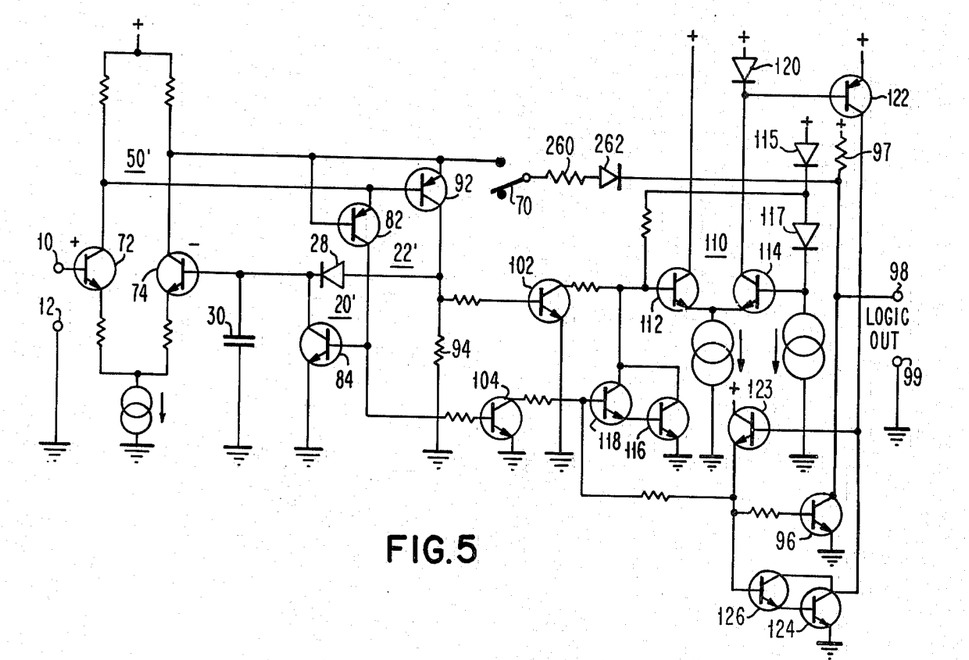
FIG. 5 is a schematic diagram of a practical circuit according to the invention for implementing the circuitry of FIG. 3 and also incorporating circuitry for imparting dual threshold peak detection according to the invention.

FIG. 5 is a circuit implementation of the basic circuitry wherein the peak detecting circuitry functions are described hereinbefore. A switch 70 is open for the immediately following discussion. The input amplifying circuit 50' comprises a pair of transistors 72, 74 with the base electrode of the transistor 72 connected to the input terminal 10 and the base electrode of the transistor 74 connected to the capacitor 30. An amplifier circuit 20' comprises two cascade transistors 82 and 84 with the emitter and base electrodes of the transistor 82 connected to the collector electrodes of the transistors 72 and 74 respectively and the collector and emitter electrodes of the transistor 84 connected across the capacitor 30. Another amplifier circuit 22' comprises a transistor 92 having the base and emitter electrodes thus connected to the collector electrodes of the transistors 72 and 74. The collector electrode of the transistor 92 is connected to the capacitor 30 by means of a diode 28 and to a load resistor 94. Only one diode, 28, is needed because the amplifier circuit 20' serves only to discharge the capacitor. This amplifier can only sink current; it cannot source current. The offset voltages for the amplifiers are provided by the difference between the base-to-emitter voltages $V_{be}$ of the two p-p-n transistors 82 and 92.

The status of the charging circuit of the peak detecting circuit according to the invention is denoted by the condition of a bistatic electric level storing circuit shown here as a level setting flip-flop circuit, preferably of the type well known as a "Schmitt trigger circuit," serving as a latch. The flow of current through the resistor 94 is sensed by a transistor 102 for creating current flow for setting the latch, while another transistor 104 is connected to the base electrode of the transistor 84 for sensing discharge of the capacitor 30 for creating a resetting current flow. The latch 110 comprises a pair of transistors 112 and 114. A pair of transistors 116 and 118 are initially conducting under which condition the base electrode of the transistor 112 is biased 0.7 volts below the base electrode of the transistor 114 by means of diodes 115 and 117 and all of the emitter current $I_e$ will flow through the transistor 114 and a diode 120. A transistor 122 is arranged to mirror the current in the diode 120 and thereby source 200 ua through a transistor 124 and an associated transistor 126. Since the transistors 116, 118 are connected together like the transistors 126 and 124 and are driven by a common transistor 123, they form a current mirror for the transistor 124. The transistor 116 thereby also sinks a current of 200 ua, thus holding the transistor 112 in the non-conducting condition. The latch 110 is then set. It is reset by pulling down the base of the electrode of the transistor 118, in the absence of set current, of course, to shift the current flow in the latch transistors from the transistor 114 to the transistor 112.

An output voltage that varies according to binary logic developed is available between the collector electrodes of the transistors 122, 124 and ground, however, the swing is low and an amplifier transistor 96 is arranged to provide a greater swing between logical 1 and φ. The emitter follower transistor 123 is arranged to sense the voltage at the collector electrode of the transistor 124 and to provide bias voltage to the Darlington-connected transistors 126 and 124, sufficient to cause the transistor 124 to conduct substantially the same current as is conducted the the transistor 122. Since the transistors 118 and 116 are substantially identical in operating characteristics to the transistors 126 and 124, and since the same base bias voltage is applied to both pairs of transistors, the transistor 116 will be made to conduct the same amount of current as is conducted by the transistor 124. The transistor 123 also provides base drive to the driver amplifier transister 96 causing it to conduct. The collector current conducted by the transistor 96 is limited by a load resistor 97. When the transistor 122 ceases to conduct, the transistor 123 ceases to apply base bias to the transistors 126, 118 and 96, and so all of these transistors 116, 96 and 124 cease to conduct.

Figure 6A:
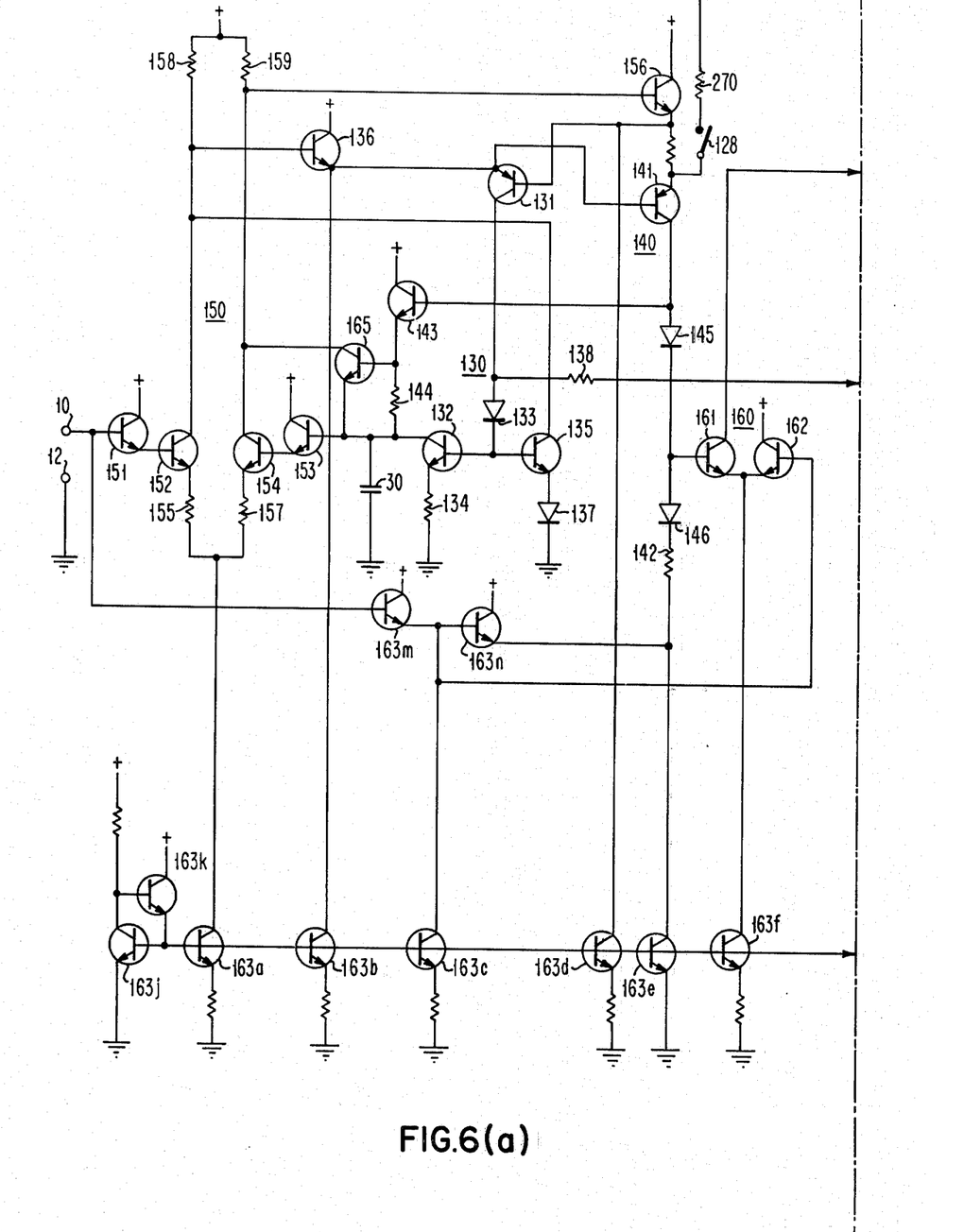
FIGS. 6(a) and 6(b) taken together are a schematic diagram of a practical embodiment of circuitry according to the invention for assembly in a semiconductor chip.
Figure 6B:
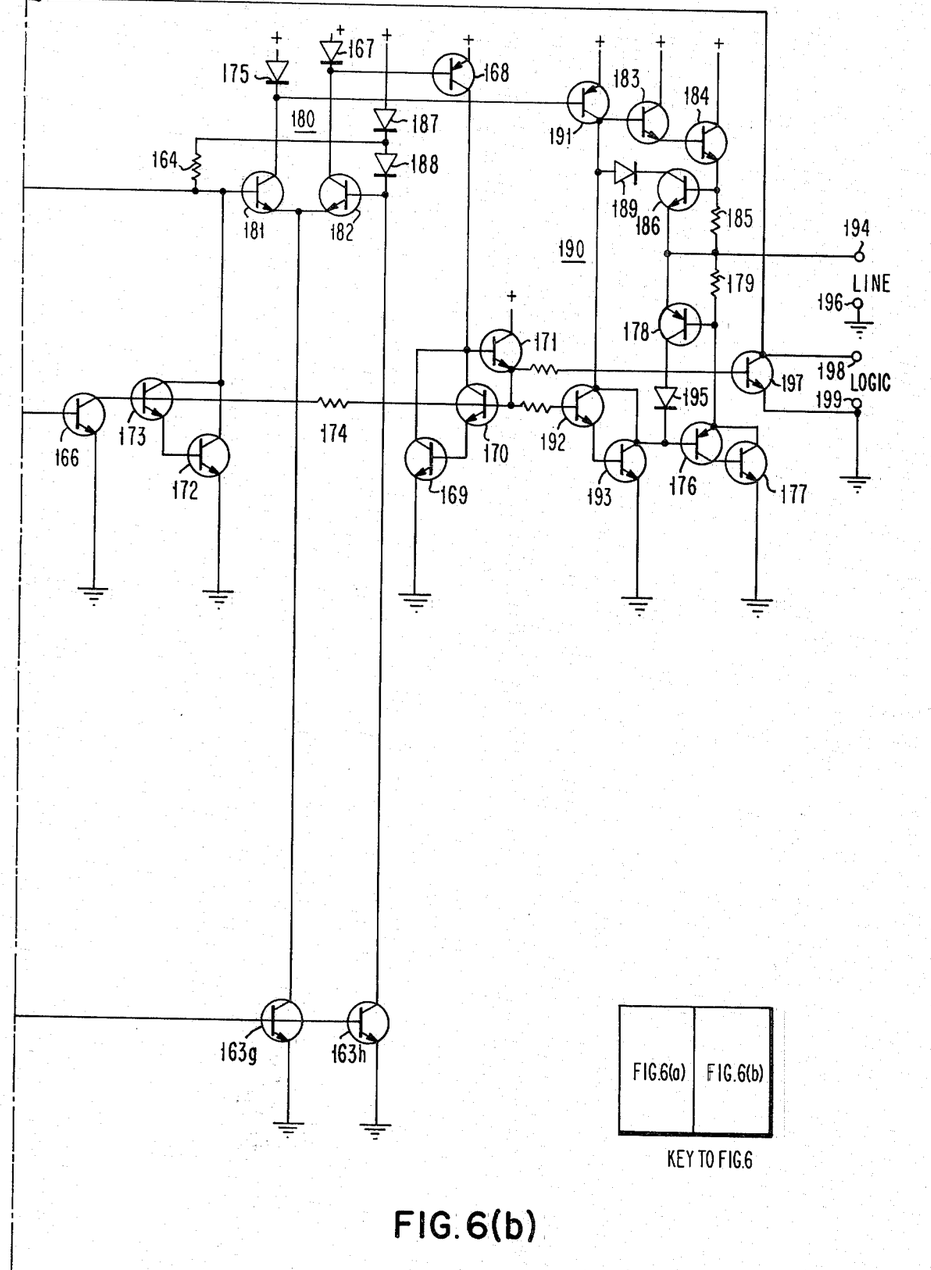

The schematic diagram of a complete peak detecting circuit built and tested is shown in FIG. 6; a switch 128 is open as shown for the immediately following discussion. The input wave is applied to input terminals 10 and 12 as before.

An input differential amplifying circuit 150 comprises four transistors 151, 152, 153, and 154, emitter lead resistors 155 and 157, a current source transistor 163a, collector load resistors 158 and 159, and output amplifier transistors 136 and 156. By way of example, the differential amplifier 150 may have a voltage gain of eleven so that the differential voltage signal appearing at the amplifier output between the emitter electrodes of transistors 136 and 156 is eleven times larger than the signal voltage appearing differentially between the input terminal and the ungrounded electrode of the capacitor 30, that is, the voltage between the base electrodes of the transistors 151 and 153.

The current source transistor 163a and seven other regulated source transistors 163g...163f have the base electrodes thereof connected in common in conventional fashion to a base potential regulating circuit comprising a resistor and two control transistors 163j and 163k. As the potential between the positive pole of the power supply and the grounded negative pole varies, the base voltage delivered at the emitter electrode of the transistor 163k maintains the base potential applied to the transistors 163a...163h at the proper value for providing the desired voltages and/or currents from the sources.

A capacitor charging amplifier circuit 140 comprises transistors 141 and 143 and a 4.3 kilohm resistor 144. A capacitor discharging amplifier circuit 130 comprises transistors 131 and 132.

Transistors 131 and 141 are connected between the output terminals of the differential amplifying circuit 150 at the emitter electrodes of output amplifier transistors 136 and 156 to activate circuitry for the discharging and charging, respectively of the capacitor 30. If the voltage applied between the input terminals 10 and 12 is substantially equal to the voltage appearing across the capacitor 30, then the amplifier output at the emitter electrodes of transistors 136 and 156 will be at substantially the same potential, and neither the transistor 131 nor 141 will conduct, and hence neither the capacitor discharging circuit 130 nor the capacitor charging circuit 140 will be activated. However, according to the example, if the voltage applied to terminal 10 is approximately 55 millivolts less than the voltage appearing across the capacitor 30, then by virtue of the amplifier gain of eleven in the example, the amplifier output at the emitter electrode of the transistor 136 will be found to be more positive than output at the emitter electrode of the transistor 156 by approximately 600 millivolts. This voltage is sufficient to cause the transistor 131 to conduct sufficient current to activate the capacitor discharging circuit 130. Similarly, when the input of the terminal 10 is approximately 55 millivolts higher than the voltage across the capacitor 30, then according to the example, the emitter electrode of the transistor 136 will be approximately 600 millivolts lower than the emitter electrode of the transistor 156, thereby causing the transistor 141 to conduct sufficient current to activate the capacitor charging circuit 140.

The capacitor discharging circuit 130 is composed of a diode 133, a transistor 132 and a resistor 134. When the transistor 131 is conducting, it provides base current to the transistor 132 throught the diode 133. This current causes the transistor 132 to conduct, and this flow of collector current discharges the capacitor 30.

A transistor 135 and a diode 137 function to limit the capacitor discharge current. When the magnitude of the discharge is sufficiently high to cause the voltage drop across the resistor 134 to equal approximately one forward diode voltage drop, then the transistor 135 will conduct, which causes additional voltage to be dropped across the load resistor 158 of the input amplifying circuit 150. This serves to decrease the voltage applied between the base and emitter of the transistor 131, thereby decreasing the base current applied to the transistor 132, and thus limiting the discharge current.

The capacitor charging circuit 140 is composed of a transistor 143 and a resistor 144, along with voltage dropping diodes 145 and 146, and the 4.3 kilohm resistor 142. The transistors 163e, 163m and 163n constitute a voltage source for the collector load resistor 142. The emitter follower transistors 163m and 163n serve to augment the bias on the base electrodes of the sensing transistors 161, 162 when any high amplitude input signals, especially transients, appear at the terminals 10. When the charging circuit is not active, the diodes 145 and 146 operate with the resistor 142 to reverse bias the base-emitter junction the transistor 143, keeping it off. When the circuit is activated by current flow from the transistor 141, the base-emitter junction of the transistor 143 is forward biased, and charging current flows through a resistor 144 into the capacitor 30. A transistor 165 provides a charging current limiting function when the voltage across the resistor 144 is substantially equal to one forward base emitter voltage drop, the transistor 165 conducts, decreasing the forward bias on the transistor 141, and thereby limiting the current through the resistor 144.

Sensing circuitry 160 for setting a latch 180 is made up of transistors 161 and 162 connected as a differential amplifier. Essentially, this amplifier, 160, senses when current starts to flow in the 4.3 kilohm resistor 142. When this current flows, capacitor charging current is about to flow. This biases the base of the transistor 161 higher than that of the transistor 162, and all of the 200 ua current applied through the transistor 163f is drawn through the resistor 164 in the latch 180. Thus the set current referred to hereinbefore is generated. A transistor 166 is effective in resetting the latch 180. It senses whenever the transistor 132 is about to conduct and effectively resets the latch.

The latch 180, FIG. 6 (b), has a differential pair of transistors 181 and 182 which conduct current from the current source transistor 163g. The base electrode of the transistor 182 is held at a fixed potential by means of the source transistor 163h and diodes 187 and 188. There is a feedback path for the latch 180. When the base of the transistor 181 is held at a potential substantially lower than the base of the transistor 182 as provided by the diode 188 and the resistor 164, substantially all of the current provided by the current source transistor 163g flows through that transistor 182 and the diode 167. A transistor 168 is connected to the diode 167 so that the voltage drop across the diode 167 also appears across the base-emitter junction of the transistor of 168, which causes that transistor 168 to conduct.

Transistors 169, 170 and 171 are arranged so that the latter transistor 171, sensing the voltage at the collector electrode of the transistor 168 will provide base current to the transistor 170 and thence to the transistor 169 when the transistor 168 starts to conduct. Almost all the current flowing in the transistor 168 will be conducted by the transistor 169.

When the transistor 169 conducts, another transistor 172 conducts a current of similar value, since the connections of the transistors 173 and 172 are identical to the connections of the transistors 169 and 170, and the base electrodes of the transistors 170 and 173 are interconnected by a resistor 174. This completes the feedback path of the latch 180 and the latch will remain in this one state, since applying a low potential to the base electrode of the transistor 181 results in the current flow just described which results in a current flow through the transistor 172 which provides for a low potential at the base electrode of the transistor 181, due to the voltage drop across a resistor 164. When the current flow through the transistor 172 is interrupted, the resistor 164 elevates the potential at the base electrode of the transistor 181 higher than the base electrode of the other transistor 182 and the current flowing through the current source transistor 163g now flows through the transistor 181 and a diode 175. The latch will stay in this other state since the current ceases in the diode 167, the transistors 168 and 169, and transistor 172.

The latch is set to one state by the differential amplifier 160, which lowers the potential of the base of the transistor 181 by providing current flow through the transistor 161 and the resistor 164, which eventually results in conduction of the transistor 172 to keep the base of the transistor 181 at a low potential. The latch can be reset to the other state by interrupting current flow in the transistor 172. This is done by the transistor 166 conducting.

The latch 180 is set to one state when the capacitor 30 is being charged. When this happens, the transistor 141 is conducting, and this also raises the potential at the base of the transistor 161 higher than the potential at the base of the transistor 162. This causes substantially all of the current through the current source transistor 163f to flow through the transistor 161, thence through the latch setting resistor 164.

The latch 180 is reset to the other state when the capacitor 30 is being discharged. This occurs when the transistor 131 conducts, which in addition to operating the discharge circuitry, also supplies base current to the transistor 166 which, when conducting, resets the latch.

Line driver circuitry 190 comprises transistors 191, 192 and 193 for providing high current drive capability and large voltage swing output for driving external loads. The output voltage produced by this driver indicates the state of the pegging latch 180. A transmission line is connected to line output terminals 194 and 196. Logic output is presented at terminals 198 and 199.

The output circuit 190 provides buffering between the latch 180 and an output terminal 194. When the latch 180 is set and the transistor 169 is conducting, a transistor 193 is also conducting, since the transistor 171 provides base current to both transistors 170 and 192.

When the transister 193 conducts, the collector voltage decreases toward ground, and this voltage is applied to the base of the compound emitter follower made up of transistors 176 and 177. This decreases the potential at the output terminal 194 and provides a low output voltage. Excess output current is sensed by the transistor 178 which conducts if the voltage dropped across resistor 179 becomes substantially equal to one base emitter forward drop. The conduction of the transistor 178 then raises the potential at the base of the transistor 176, which raises the output voltage until the output current is in the allowable range.

When the latch 180 is reset, the transistor 181 is conducting, which makes the transistor 191 conduct and consequently elevate the potential at the collector electrode. This causes the (Darlington connected) emitter follower transistors 183 and 184 to raise the potential appearing at the output terminal 194 to a high level. Overcurrent protection is provided by a resistor 185 and a transistor 186, as before.

An amplifying transistor 197 drives the transmission line or other load connected to the output terminal 198. When the latch 180 is set and the transistor 171 is providing base current directly to transistors 170, 173 and 192, it also provides base current to the transistor 197 which conducts if the external circuit provides current at the terminal 198 for energizing the amplifier transistor 197.

Peak detecting circuitry as described hereinbefore may be less than wholly accurate under adverse conditions. In the use of hand held magnetic record scanning apparatus with some available magnetic labels, for example, considerable electric noise is generated which frequently rises to a value that results in false peak indication and consequent scanning error.

In reading magnetic stripe documents with a magneto-resistive (MR) transducer, only one of the peaks of the signal waveform (say, the positive one) carries timing information. Conventional peak detecting circuitry extracts the timing information by providing a digital output transition shortly after the occurrence of this peak. In order to minimize timing error, it is desirable for the peak detector to have a low threshold, because the lower the threshold the less waveform reversal must occur before the circuit senses the presence of a peak. However, as the threshold is lowered, the circuit also becomes more sensitive to noise.

Under certain conditions, and while reading certain types of magnetic media, it has been observed that a large amount of noise will exist in the vicinity of the negative peaks of the input waveform. Even though the noise occurs on the waveform at a place where there is no timing information, the peak detector will indicate the presence of a false peak in the waveform, and thereby cause an error by inserting extra "data" bits into the output data. If the threshold is raised to become insensitive to this noise, then large timing errors will be introduced.

According to the invention one solution to this problem is to modify the threshold of the peak detector so that a large threshold is effective when approaching the peak with the noise, and then a low threshold is substituted when approaching the opposite peak so that the timing information is accurately sensed.

Figure 7:
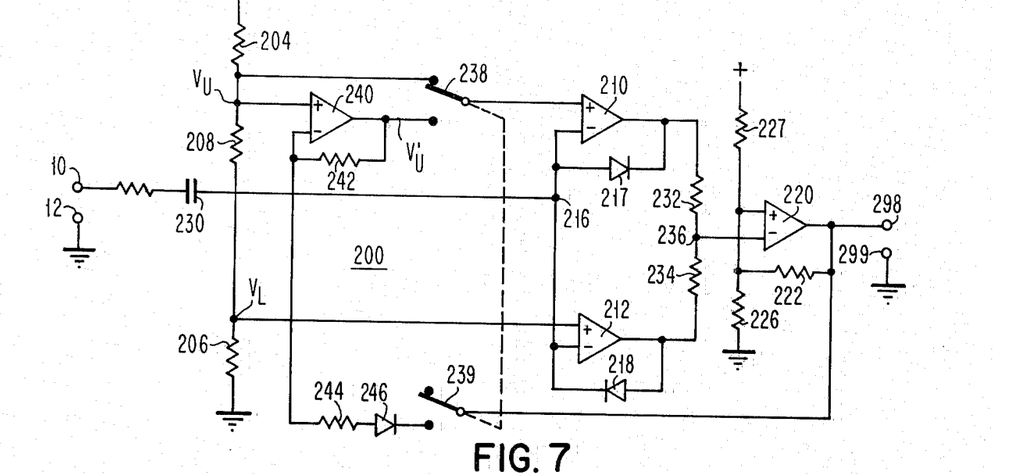
FIG. 7 is a functional diagram of other peak detecting circuitry having additional connections for dual threshold mode of operation according to the invention.

FIG. 7 is a logic diagram of a peak detecting circuit arrangement as first disclosed in U.S. Pat. No. 3,895,237 with a comparator circuit as first published in the IBM Technical Disclosure Bulletin Vol. 17, No. 6 for November 1974 on pages 1774–5 and modified in accordance with the invention directed to dual threshold operation.

The peak detector 200 utilizes operational amplifiers with feedback diodes as voltage-responsive devices. In the detector 200 the input terminal 10 is coupled through a capacitor 230 to a junction terminal 216. The junction terminal 216 is coupled to the negative input terminals of the operational amplifiers 210 and 212, and diodes 217 and 218 are coupled between the negative input terminals and the output terminals of the amplifiers. In the present example, the operational amplifiers 210 and 212 comprise integrated circuits sold under the designation SN52558 by the Texas Instruments Company. Reference voltages are provided by an arrangement which includes a pair of like resistors 204 and 206, and a resistor 208. Positive operating potential is applied to the positive input terminal of the operational amplifier 210 through the resistor 204. Similarly, a ground connection is connected to the positive input terminal of the operational amplifier 212 through the resistor 206. The resistor 208, which determines the size of the dead zone, is coupled between the positive input terminals of the amplifiers 210 and 212. The resistor 208 can be variable or can be replaced with resistors of other value to change the size of the dead zone, as required.

The output terminals of the operational amplifiers 210 and 212 are coupled to a comparator comprising a third amplifier 220 and five resistors 222, 226, 227, 232 and 234. The third amplifier 220 is connected to operate as a Schmitt trigger circuit. Positive feedback through the resistor 222 gives the circuit hysteresis, which is required for proper operation. The ratios between the three resistors 222, 224 and 226 on the positive input terminal of the comparator 220, set the upper and lower thresholds at which the comparator changes its output state. This circuit configuration is well known in the art. The negative input to the Schmitt trigger circuit is supplied by a summer having two resistors 232, 234. The waveform that appears at the junction 236 is one-half of the algebraic sum of the voltages appearing at the outputs of the two input amplifiers 210, 212.

A switch having two arms 238 and 299 is shown in the interest of clarity. Dual thresholding according to the invention is effected by throwing the switch arm to the opposite contacts, whereby a differential amplifier 240 is interposed between the junction between the reference resistors 204, 208 and the input terminal of the amplifier 210 formerly connected thereto. The inverting terminal of the amplifier 240 is connected to the output thereof by a resistor 242 and by a resistor 244 and a diode 246 connected in series to the output of the comparator 220.

When the analog input signal applied at the terminals 10, 12 is going in the positive direction toward the positive peak, the digital output is up, and diode 246 is reverse biased. This makes amplifier 240 function as a unity gain voltage follower, and a voltage $V_U$ is applied to the peak detector directly as $V'_U$, the upper threshold voltage. When the positive peak has passed, however, and the digital output has fallen as a result, the diode 246 is forewward biased. This makes the amplifier 240 operate with a small gain, and $V_U$ is amplified to the slightly higher voltage $V'_U$ which is the new upper threshold voltage. Thus the threshold, and hence the noise sensitivity has been modified to a new value for the negative portions of the input waveform.

Figure 8:
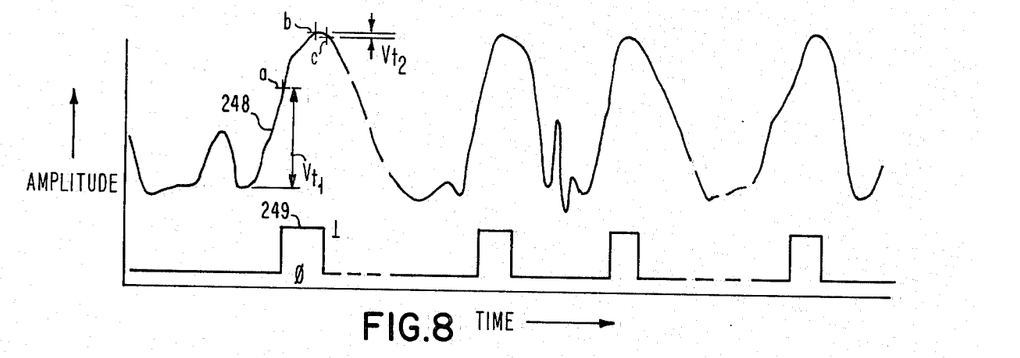
FIG. 8 is a graphical representation of waveforms obtained with dual threshold peak detecting circuitry according to the invention.

The operation of the circuit of FIG. 7 is shown in FIG. 8. The upper waveform is a graphical representation 248 of an analog input signal, and the lower waveform 249 represents the resulting digital data. Note that considerable noise can be present in the lower portions of the waveform without causing "extra bits" in the digital data, and yet the circuit is very sensitive to changes in the waveform near the positive peaks, and responds very soon after the positive peak has passed. All the timing information is contained in the time of occurrence of the falling edges of the digital data.

With the circuit operating in a first threshold mode the output data changes from $\phi$ to 1 at a point a, at amplitude $Vt_1$, and almost simultaneously the thresholding is changed to a second threshold mode as a peak, b, of the wave is approached. The second threshold voltage $Vt_2$ causes operation of the circuit after the peak is passed but only shortly thereafter to return the output data to $\phi$ at a point c. The timing data sought is therefore indicated on the falling or trailing edge of each timing pulse.

Figure 9:
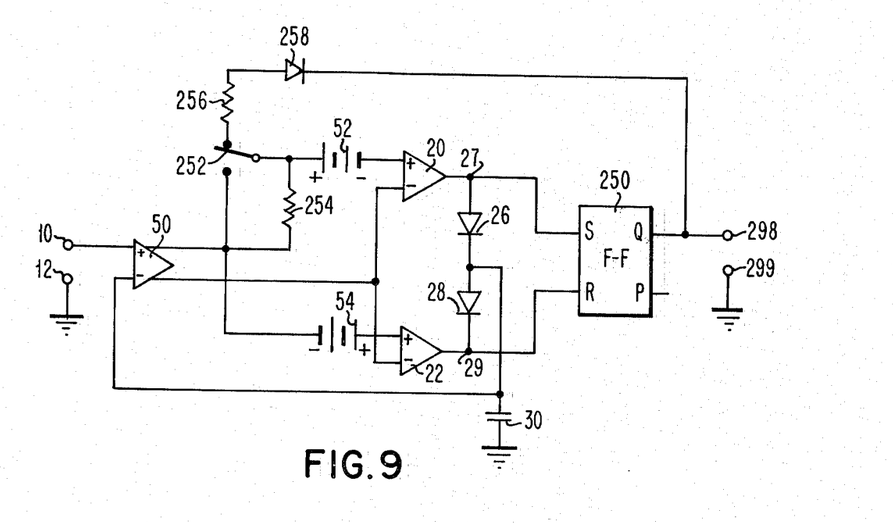
FIG. 9 is a functional diagram of further peak detecting circuitry having additional connections for dual threshold mode of operation according to the invention.

Other peak detector configurations lend themselves to the same kind of modifications. FIG. 9 is a logical diagram of a peak detector circuit as shown in FIG. 3 having a form of bistatic electric level storing circuit of a conventional circuit configuration shown here as a latching flip-flop circuit 250 in the output circuit as described in the above mentioned U.S. Pat. No. 3,895,237 as modified for dual thresholding according to the invention. A switch 252 shorts a resistor 254 in the single threshold mode and connects another resistor 256 and a diode 258 in series to the logical output Q terminal of the flip-flop circuit 250 and the logical output terminals 298, 299. A dual threshold voltage is effected by modifying the threshold voltage $V_{th}$ applied to the amplifying circuit 20. When the analog input signal is in the vicinity of its noisiest region, (the negative peak in this example) then the output of the latch 250 is down, forward biasing the diode 258. By the action of the voltage divider formed as the resistors 254, 256, the threshold voltage applied to the non-inverting input of the amplifier 20 is lowered, thereby requiring a larger signal reversal to set the latch 250. Once this region is passed and the latch has been set, the diode 258 is reversed biased and the normal threshold voltage is applied to the amplifier 20 for use during the positive peaks. Thus the threshold, and hence the noise sensitivity has been modified to a new value for the negative portions of the input waveform.

The diode 258 connecting the digital output to the threshold input of one of the amplifiers actually is not always required for proper operation. All that is really required is that the digital output change the threshold voltage as it changes from one state to the other.

Returning to FIG. 5, closing of the switch 70 serves to connect a resistor 260 and a diode 262 (not actually needed in most cases) in series from the emitter electrode of the transistor 92 and the collector electrode of the output amplifier transistor 96 to convert this single threshold circuit to a dual threshold peak detector as shown. The added components accomplish the same thing as in the previous circuits. They are arranged to alter the threshold voltage fed back to one of the amplifiers during a portion of the input signal.

Returning to FIG. 6, which shows the integrated circuit version of the peak detector given in FIG. 5, the modification necessary to convert it to a dual threshold peak detector comprises a single resistor 270 connected from the collector electrode of the logical output driver transistor 187 back to the emitter electrode of the transistor 141 of the charging subcircuit 140 by closing the switch 128. No diode is shown in this feedback circuit as none is required for proper operation. All that is really required is that the digital output change the threshold voltage as it changes from one state to the other.

This discussion has been limited to circuits for providing a high threshold for negative peaks and a low threshold for positive peaks. However, the opposite case is accommodated without difficulty, if the waveform happens to be inverted from the ones shown and discussed.

While the invention has been described in terms of express embodiments, and alternatives have been suggested, it is clearly to be understood that those skilled in the art will effect further changes without departing from the spirit and scope of the invention as defined in the appended claims concluding the specification.

The invention claimed is:

1. Peak detecting circuitry, comprising
a pair of signal input terminals at which an electric wave is applied for determining the occurrence of peak values thereof,
a pair of detector output terminals at which an electric energy level is presented for indicating the occurrence of said peak values,
a differential amplifying circuit having one input terminal connected to one of said pair of signal input terminals, having another input terminal, and having a pair of differential output terminals,
an electric energy storage device connected between said other input terminal of said differential amplifying circuit and said other terminal of said pair of signal input terminals,
one differential amplifier circuit having a pair of input terminals individually connected to both of said differential output terminals of said amplifying circuit and having an output terminal connected to said storage device for charging the same,
another dfferential amplifier circuit having a pair of input terminals individually connected to both of said differential output terminals of said amplifying circuit and having an output terminal connected to said storage device for discharging the same, and
electric level conveying circuit connections between said detector output terminals and said output terminals of said amplifier circuits.

2. Peak detecting circuitry, comprising:
a pair of signal input terminals at which an electric wave is applied for determining the occurrence of peak values thereof,
a pair of detector output terminals at which an electric energy level is presented for indicating the occurrence of said peak values,
a differential amplifying circuit having one input terminal connected to one of said signal input terminals, having another input terminal, and having a pair of differential output terminals,
an electric energy storage device connected between said other input terminal of said differential amplifying circuit and said other of said pair of signal input terminals,
two differential amplifier circuits each having output terminals coupled in common to said storage device and each having a pair of input terminals individually connected to both of said differential output terminals of said amplifying circuit, with one amplifier circuit connected for charging said storage device and the other connected for discharging the same, and
electric circuit connections between said detector output terminals and said output terminals of said amplifier circuits.

3. Peak detecting circuitry as defined in claim 1 and incorporating
a semiconductor device interposed in said one amplifier circuit for charging said capacitor,
whereby said capacitor is prevented from being discharged by electric circuit connections from said capacitor to said point of reference potential when said one amplifier circuit is in a condition other than for charging said capacitor.

4. Peak detecting circuitry as defined in claim 3 and wherein said semiconductor device is a transistor.

5. Peak detecting circuitry as defined in claim 3 and wherein said semiconductor device is a diode.

6. Peak detecting circuitry as defined in claim 1 and incorporating
a flip-flop circuit, having set, reset and output terminals,
a sensing circuit connected between said one amplifier circuit and said set terminal of said flip-flop circuit, and
another sensing circuit connected between said other amplifier circuit and said reset terminal of said flip-flop circuit.

7. Peak detecting circuitry comprising a pair of input terminals at which an electric wave is applied for determining the occurrence of peak values thereof with one of said terminals at a point of fixed reference potential,
a differential amplifying circuit having circuit differential input terminals with one of said differential input terminals connected to the other of said signal input terminals and having circuit differential output terminals,
said differential amplifying circuit comprising two transistors having base electrodes individually connected to said circuit differential input terminals, collector electrodes connected to said circuit differential output terminals, and emitter electrodes connected to said point of fixed reference potential,
a capacitor connected between said other circuit differential input terminal of said differential amplifying circuit and said one of said pair of said electric wave input terminals,
one amplifier circuit having differential input terminals individually connected to both of said circuit differential output terminals of said amplifying circuit and having an output terminal connected to said capacitor for charging the same, and
another amplifier circuit having differential input terminals individually connected to both of said circuit differential output terminals of said amplifying circuit and having an output terminal connected to said capacitor for discharging the same, said amplifier circuits each having at least one input circuit transistor having a base electrode and an emitter electrode individually connected to said circuit differential output terminals of said amplifying circuit and having a collector electrode with the connections of the base electrode of one transistor and the emitter electrode of the other transistor being connected together to one of said circuit differential output terminals of said amplifying circuit, in each instance, and said amplifier circuits presenting base-emitter circuit voltage drops of said two input circuit transistors diminished by the gain of said differential amplifying circuit as offset dead zone voltages between the instantaneous potential value of said electric wave and of the potential of the charge stored in said capacitor.

8. Peak detecting circuitry as defined in claim 7 and wherein said one amplifier circuit comprises at least one transistor coupled through base and emitter electrodes across the collector electrodes of said transistors in said differential amplifying circuit and having a collector electrode a load resistor connected to said collector electrode, and a semiconductor device interconnecting the junction between said collector electrode and said load resistor to the terminal of said capacitor connected to the base electrode of one of said amplifying circuit transistors.

9. Peak detecting circuitry as defined in claim 8 and wherein said other amplifier circuit comprises at least one transistor similarly and oppositely coupled to the connections of said one transistor across the collector electrodes of said amplifying circuit transistors and having a collector electrode, and a further transistor having a collector-emitter circuit connected across said capacitor and a base electrode connected to the collector electrode of said other amplifier circuit.

10. Peak detecting circuitry as defined in claim 6 and wherein said flip-flop circuit comprises two transistors with emitter electrodes connected in common to said point of fixed reference potential, collector electrodes individually connected to unilateral load devices and base electrodes, one of said base electrodes being connected to a point of predetermined reference potential, a biasing resistor connecting to other of said base electrodes to a point of reference potential substantially fixed above said predetermined reference potential, the other of said base electrodes being connected to the first said sensing circuit for setting said flip-flop circuit, and a further transistor circuit having a collector electrode connected to said other base electrodes, an emitter electrode connected to said point of fixed reference potential, and a base electrode connected to said other sensing circuit for resetting said flip-flop circuit.

11. Peak detecting circuitry, comprising a pair of signal input terminals at which an electric wave is applied for determining the occurrence of peak values thereof, a pair of detector output terminals at which an electric energy level is presented for indicating the occurrence of said peak values, a differential amplifying circuit having one input terminal connected to one of said pair of signal input terminals, having another input terminal, and having a pair of differential output terminals, an electric energy storage device connected between said other input terminal of said differential amplifying circuit and said other of said pair of signal input terminals, one differential amplifier circuit having a pair of input terminals individually connected to both of said differential output terminals of said amplifying circuit and having an output terminal coupled to said storage device for charging the same, another differential amplifier circuit having a pair of input terminals individually connected between both of said differential output terminals of said amplifying circuit and having an output terminal coupled to said storage device for discharging the same, and an electric circuit element having a pair of input terminals individually connected to said output terminals of said amplifier circuits, at least one output terminal connected to one of said detector output terminals, and an electric connection between said one output terminal of said electric circuit element and said input terminals of at least one of said differential amplifier circuits.

12. Peak detecting circuitry as defined in claim 11 and wherein said electric circuit element comprises a latching flip-flop circuit, and said electric connection comprises a resistive element.

13. Peak detecting circuitry as defined in claim 11 and wherein said electric circuit element comprises a level triggering circuit, and said electric connection comprises a resistive element.

14. Peak detecting circuitry as defined in claim 7 and incorporating a flip-flop circuit having input terminals connected individually to said output terminals of said amplifier circuits and having one output terminal connected to said one amplifier circuit for varying the threshold by the output level of said flip-flop circuit.

15. Peak detecting circuitry comprising a pair of signal input terminals at which an electric wave is applied for determining the occurrence of peak values thereof, a pair of detector output terminals at which a bistatic electric wave is delivered for indicating the times of occurrence of peak values of said applied electric wave, a differential amplifying circuit having one input terminal connected to one of said signal input terminals, having another input terminal, and having a pair of differential output terminals, a capacitor having one terminal connected to said other input terminal of said differential amplifying circuit and having another terminal connected to the other of said signal input terminals, a discharging circuit connected across said capacitor and having a control input terminal, one amplifier circuit having an input terminal connected to one of said output terminals of said differential amplifying circuit and having an output terminal connected to said discharging circuit control input terminal, a charging circuit having one terminal connected to said one terminal of said capacitor, having another terminal and having a control input terminal, another amplifier circuit having an input terminal connected to the other of said output terminals of said differential amplifying circuit and having an output terminal connected to said other terminal of said charging circuit, a bistatic electric level storing circuit having two input terminals individually connected to said output terminals of both said amplifier circuits and having at least one output terminal connected to one of said detector output terminals, and an electric connection between said one output terminal of said storing circuit and said control input terminal of said charging circuit.

16. Peak detecting circuitry as defined in claim 15 and incorporating a current driving circuit having an input terminal coupled to said storing circuit and having an output terminal connected to said output delivery terminals.

17. Peak detecting circuitry as defined in claim 15 and incorporating a resistive element interposed in said electric connection.

18. Peak detecting circuitry as defined in claim 17 and wherein said capacitor is protected by unintended discharge from a unilateral impedance element.

19. Peak detecting circuitry, comprising a pair of signal input terminals at which an electric wave is applied for determining the occurrence of peak values thereof with one of said terminals at a point of fixed reference potential, a pair of detector output terminals at which a bistatic electric wave is delivered for indicating the times of occurrence of peak values of said applied electric wave with one of said terminals at said point of fixed reference potential, a differential amplifying circuit having one input terminal connected to the other of said signal input terminals, having another input terminal, and having a pair of differential output terminals, a capacitor having one terminal connected to said other input terminal of said differential amplifying circuit and having another terminal connected to said point of fixed reference potential, a discharging circuit connected across said capacitor and having a control input terminal, one amplifier circuit having an input terminal connected to one of said output terminals of said differential amplifying circuit and having an output terminal connected to said discharging circuit control input terminal, another amplifier circuit having an input terminal connected to the other of said output terminals of said differential amplifying circuit and having an output terminal connected to said other terminal of said charging circuit, and a bistatic storing circuit having two input terminals individually connected to said output terminals of both said amplifier circuits and having an output terminal connected to said other one of said detector output delivery terminals.

20. Peak detecting circuitry as defined in claim 19 and incorporating an electric connection between said output terminal of said storing circuit and said control input terminal of said charging circuit.

* * * * *

UNITED STATES PATENT AND TRADEMARK OFFICE
CERTIFICATE OF CORRECTION

PATENT NO. : 4,163,909

DATED : August 7, 1979

INVENTOR(S) : Jerome D. Harr

It is certified that error appears in the above—identified patent and that said Letters Patent are hereby corrected as shown below:

In claim 3, line 1, for "1" read --7--;

in claim 6, line 1, for "1" read --7--; and in claim 18, line 2, for "by" read --from--, and line 3, for "from" read --by--.

Signed and Sealed this

Twenty-second Day of January 1980

[SEAL]

Attest:

SIDNEY A. DIAMOND

Attesting Officer

Commissioner of Patents and Trademarks